US012677479B2

(12) United States Patent
Choi et al.

(10) Patent No.: US 12,677,479 B2
(45) Date of Patent: Jul. 7, 2026

(54) THIN FILM TRANSISTOR ARRAY SUBSTRATE INCLUDING OXIDE SEMICONDUCTOR PATTERN AND DISPLAY DEVICE INCLUDING THE SAME

(71) Applicant: LG Display Co., Ltd., Seoul (KR)

(72) Inventors: Sung Ju Choi, Seoul (KR); Jung Seok Seo, Seoul (KR); Jae Yoon Park, Seoul (KR); Seo Yeon Im, Seoul (KR); Jin Won Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 323 days.

(21) Appl. No.: 18/230,226

(22) Filed: Aug. 4, 2023

(65) Prior Publication Data

US 2024/0072064 A1 Feb. 29, 2024

(30) Foreign Application Priority Data

Aug. 31, 2022 (KR) ........................ 10-2022-0110165

(51) Int. Cl.
*H01L 27/12* (2006.01)
*H10D 86/01* (2025.01)
(Continued)

(52) U.S. Cl.
CPC ......... *H10D 86/60* (2025.01); *H10D 86/0223* (2025.01); *H10D 86/423* (2025.01);
(Continued)

(58) Field of Classification Search
CPC .... H10D 86/60; H10D 86/0223; H10D 86/01; H10D 86/423; H10D 86/40;
(Continued)

(56) References Cited

U.S. PATENT DOCUMENTS 10,153,446 B2 * 12/2018 Maruyama ......... H10K 59/1213
11,659,738 B2 * 5/2023 Wang ................... H10K 59/131
257/43
(Continued)

FOREIGN PATENT DOCUMENTS

EP 4195277 A1 6/2023
EP 4287257 A1 12/2023
(Continued)

OTHER PUBLICATIONS

English Translation of KR-10-2068089.*
(Continued)

*Primary Examiner* — Nikolay K Yushin
(74) *Attorney, Agent, or Firm* — PnK IP LLC

(57) ABSTRACT

The disclosure provides an array substrate of a thin film transistor including an oxide semiconductor pattern, and a display device using the same. The thin film transistor array substrate includes a substrate including an active area and a non-active area disposed around the active area, and a first thin film transistor disposed on the substrate. The first thin film transistor includes a first oxide semiconductor pattern disposed on the substrate, a first gate electrode disposed under the first oxide semiconductor pattern while overlapping with the first oxide semiconductor pattern, a first source electrode and a first drain electrode disposed on the first oxide semiconductor pattern and connected to the first oxide semiconductor pattern, and a first light shielding pattern disposed over the first oxide semiconductor pattern and electrically connected to one of the first source electrode and the first drain electrode while overlapping with the first oxide semiconductor pattern.

24 Claims, 9 Drawing Sheets

(51) Int. Cl.
  *H10D 86/40* (2025.01)
  *H10D 86/60* (2025.01)
  *H10K 59/12* (2023.01)
  *H10K 59/126* (2023.01)

(52) U.S. Cl.
  CPC ....... *H10D 86/481* (2025.01); *H10K 59/1201* (2023.02); *H10K 59/126* (2023.02)

(58) Field of Classification Search
  CPC .. H10D 86/481; H10D 86/431; H10D 86/425; H10D 30/6729; H10D 30/67; H10D 30/6723; H10D 30/6755; H10D 30/6713; H10D 86/471; H10K 59/1201; H10K 59/12; H10K 59/126; H10K 59/1213; H10K 59/121; H10K 59/123; H10K 50/805; H10K 50/865; H10K 50/86; H10K 10/84; H10K 10/80; H10K 10/00; H10K 59/805; H10K 59/80; H10K 59/8792; H10K 50/11; H10K 50/81; H10K 50/82
  See application file for complete search history.

(56) References Cited

U.S. PATENT DOCUMENTS

| | | | |
|---|---|---|---|
| 2011/0049523 | A1 | 3/2011 | Choi et al. |
| 2013/0313545 | A1 | 11/2013 | Saito et al. |
| 2015/0144904 | A1 | 5/2015 | Jeong et al. |
| 2016/0329390 | A1 | 11/2016 | Onc |
| 2018/0090695 | A1* | 3/2018 | Maruyama ........... H10D 86/423 |
| 2019/0067603 | A1 | 2/2019 | Maruyama |
| 2019/0189723 | A1 | 6/2019 | Kim et al. |
| 2020/0111855 | A1 | 4/2020 | Bae et al. |
| 2021/0202647 | A1* | 7/2021 | Wang ................... H10K 59/126 |
| 2021/0225878 | A1 | 7/2021 | Koo et al. |
| 2024/0257686 | A1 | 8/2024 | Choi |

FOREIGN PATENT DOCUMENTS

| | | | | |
|---|---|---|---|---|
| KR | 10-2011-0021259 | | 3/2011 | |
| KR | 10-2015-0059949 | | 6/2015 | |
| KR | 10-2017-0129508 | | 11/2017 | |
| KR | 10-2019-0073849 | | 6/2019 | |
| KR | 10-2068089 | * | 1/2020 | ............. H01L 29/78 |
| KR | 102068089 | B1 * | 1/2020 | ............. H10D 30/67 |
| KR | 10-2021-0135202 | | 11/2021 | |

OTHER PUBLICATIONS

Machine translation of KR 102068089 (Year: 2020).*
GB Office Action dated Feb. 20, 2024 issued in Patent Application No. GB2312715.2 (10 pages).
Examination Report dated Oct. 27, 2025 issued in UK Patent Application No. GB2312715.2.

* cited by examiner

THIN FILM TRANSISTOR ARRAY SUBSTRATE INCLUDING OXIDE SEMICONDUCTOR PATTERN AND DISPLAY DEVICE INCLUDING THE SAME

This application claims the benefit of Korean Patent Application No. 10-2022-0110165, filed on Aug. 31, 2022, which is hereby incorporated by reference as if fully set forth herein.

TECHNICAL FIELD

The present disclosure relates to an array substrate of a thin film transistor including an oxide semiconductor pattern, and more particularly to a thin film transistor array substrate enabling a thin film transistor disposed on a substrate to achieve low-grayscale expression, block leakage current, and increase a threshold voltage, and a display device including the same. In particular, the present disclosure relates to a display device in which an s-factor value of a driving thin film transistor is increased, thereby being capable of realizing a rapid on/off operation while achieving grayscale expression across a wide range.

BACKGROUND

Recently, in accordance with advances in multimedia, the importance of a flat display device has increased. To cope with such a situation, flat display devices such as a liquid crystal display device, a plasma display device, an organic light emitting display device, etc. are being commercialized. Among such flat display devices, the organic light emitting display device is currently mainly used due to a fast response time, high luminance, and a wide viewing angle.

In such an organic light emitting device, a plurality of pixels is disposed in a matrix, and each of the pixels includes a light emitting device part represented by an organic light emitting layer and a pixel circuit represented by a thin film transistor (hereinafter referred to as a "TFT"). The pixel circuit includes a driving TFT configured to operate an organic light emitting element through supply of drive current and a switching TFT configured to supply a gate signal to the driving TFT.

In addition, a gate driving circuit part configured to provide a gate signal to each pixel may be disposed in a non-active area of the organic light emitting display device.

SUMMARY

The present disclosure relates to an array substrate of a thin film transistor disposed at a pixel, in particular, a pixel circuit part of a sub-pixel, and configured to block leakage current in an off state and to achieve free grayscale expression even at low gray levels, and a display device including the same. Accordingly, the present disclosure is directed to a thin film transistor array substrate including an oxide semiconductor pattern and a display device including the same that substantially obviate one or more problems due to limitations and disadvantages of the related art.

An object of the present disclosure is to provide a thin film transistor disposed within a pixel exhibiting a high effect of blocking leakage current in an off state.

Another object of the present disclosure is to provide a thin film transistor using an oxide semiconductor pattern as an active layer thereof to achieve grayscale expression at low gray levels and increase a threshold voltage.

Another object of the present disclosure is to provide an array substrate of a thin film transistor having an increased s-factor value and a display device including the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a thin film transistor array substrate includes a substrate including an active area and a non-active area disposed around the active area, and a first thin film transistor disposed on the substrate, wherein the first thin film transistor includes a first oxide semiconductor pattern disposed over the substrate, a first gate electrode disposed under the first oxide semiconductor pattern while overlapping with the first oxide semiconductor pattern, a first source electrode and a first drain electrode disposed over and connected to the first oxide semiconductor pattern, and a first light shielding pattern disposed over the first oxide semiconductor pattern while overlapping with the first oxide semiconductor pattern, the first light shielding pattern being connected to one of the first source electrode and the first drain electrode.

The thin film transistor array substrate may further include a second thin film transistor disposed on the substrate. The second thin film transistor may include a second oxide semiconductor pattern disposed over the substrate, a second gate electrode disposed under the second oxide semiconductor pattern while overlapping with the second oxide semiconductor pattern, a second source electrode and a second drain electrode disposed over and connected to the second oxide semiconductor pattern, and a second light shielding pattern disposed over the second oxide semiconductor pattern while overlapping with the second oxide semiconductor pattern.

At least one of the first gate electrode or the first light shielding pattern may include a semiconductor material layer.

At least one of the second gate electrode or the second light shielding pattern may include a semiconductor material layer.

The thin film transistor array substrate may further include a third thin film transistor disposed on the substrate. The third thin film transistor may include a polycrystalline semiconductor pattern disposed on the substrate, a third gate electrode disposed over the polycrystalline semiconductor pattern while overlapping with the polycrystalline semiconductor pattern, and a third source electrode and a third drain electrode disposed over and connected to the polycrystalline semiconductor pattern.

The first thin film transistor may be a driving thin film transistor configured to drive a pixel in the active area. The second thin film transistor may be a switching thin film transistor disposed in the pixel.

The third thin film transistor may be a switching thin film transistor disposed in at least one of the active area or the non-active area.

The semiconductor material layer may be made of a P-type semiconductor material. Each of the first oxide semiconductor pattern and the second oxide semiconductor pattern may be made of an N-type semiconductor material.

Each of the polycrystalline semiconductor pattern and the semiconductor material layer may be made of a P-type semiconductor material. Each of the first oxide semiconductor pattern and the second oxide semiconductor pattern may be made of an N-type semiconductor material.

At least one of the first gate electrode, the first light shielding pattern, the second gate electrode or the second light shielding pattern may have a stack structure of a metal pattern and the semiconductor material layer.

Light reflectivity of the semiconductor material layer may be lower than light reflectivity of the metal pattern.

The thin film transistor array substrate may further include a storage capacitor disposed on the substrate. The storage capacitor may include a first electrode disposed on the same layer as the third gate electrode, and a second electrode disposed on the same layer as the first light shielding pattern.

The polycrystalline semiconductor pattern, the first gate electrode, and the second gate electrode may be disposed on the same layer.

The first gate electrode, the second gate electrode, and the third gate electrode may be disposed on the same layer.

The second gate electrode and the second light shielding pattern may be electrically interconnected to constitute a double gate.

A first parasitic capacitance generated between the first oxide semiconductor pattern and the first light shielding pattern may be greater than a second parasitic capacitance generated between the first oxide semiconductor pattern and the first gate electrode.

A first distance between the first oxide semiconductor pattern and the first light shielding pattern may be smaller than a second distance between the first oxide semiconductor pattern and the first gate electrode.

The polycrystalline semiconductor pattern and the semiconductor material layer may be constituted by the same kind of semiconductor material.

Each of the first gate electrode and the second gate electrode may have a structure in which the metal pattern and the semiconductor material layer are sequentially stacked in this order. Each of the first light shielding pattern and the second light shielding pattern may have a structure in which the semiconductor material layer and the metal pattern are sequentially stacked in this order.

In another aspect of the present disclosure, there is provided a display device including the thin film transistor array substrate and a light emitting device part. The light emitting device part is connected to the first thin film transistor. The light emitting device part includes an anode connected to the first drain electrode, a cathode corresponding to the anode, and an organic light emitting layer disposed between the anode and the cathode.

Objects of the present disclosure are not limited to the above-described objects, and other objects of the present disclosure not yet described will be more clearly understood by those skilled in the art from the following detailed description.

BRIEF DESCRIPTION OF THE DRAWINGS

The accompanying drawings, which are included to provide a further understanding of the disclosure and are incorporated in and constitute a part of this application, illustrate aspect(s) of the disclosure and along with the description serve to explain the principle of the disclosure. In the drawings:

FIG. 6 is a cross-sectional view showing one thin film transistor disposed at a gate driving circuit part in a non-active area, a driving thin film transistor and a switching thin film transistor each disposed in an active area while including a light shielding pattern constituted by a semiconductor material layer, and a storage capacitor in accordance with a third aspect of the present disclosure; and FIG. 7 is a cross-sectional view showing one thin film transistor disposed at a gate driving circuit part in a non-active area, a driving thin film transistor and a switching thin film transistor each disposed in an active area while including a light shielding pattern having a stack structure of a metal pattern and a semiconductor material layer, and a storage capacitor in accordance with a fourth aspect of the present disclosure.

DETAILED DESCRIPTION

Figure 1:
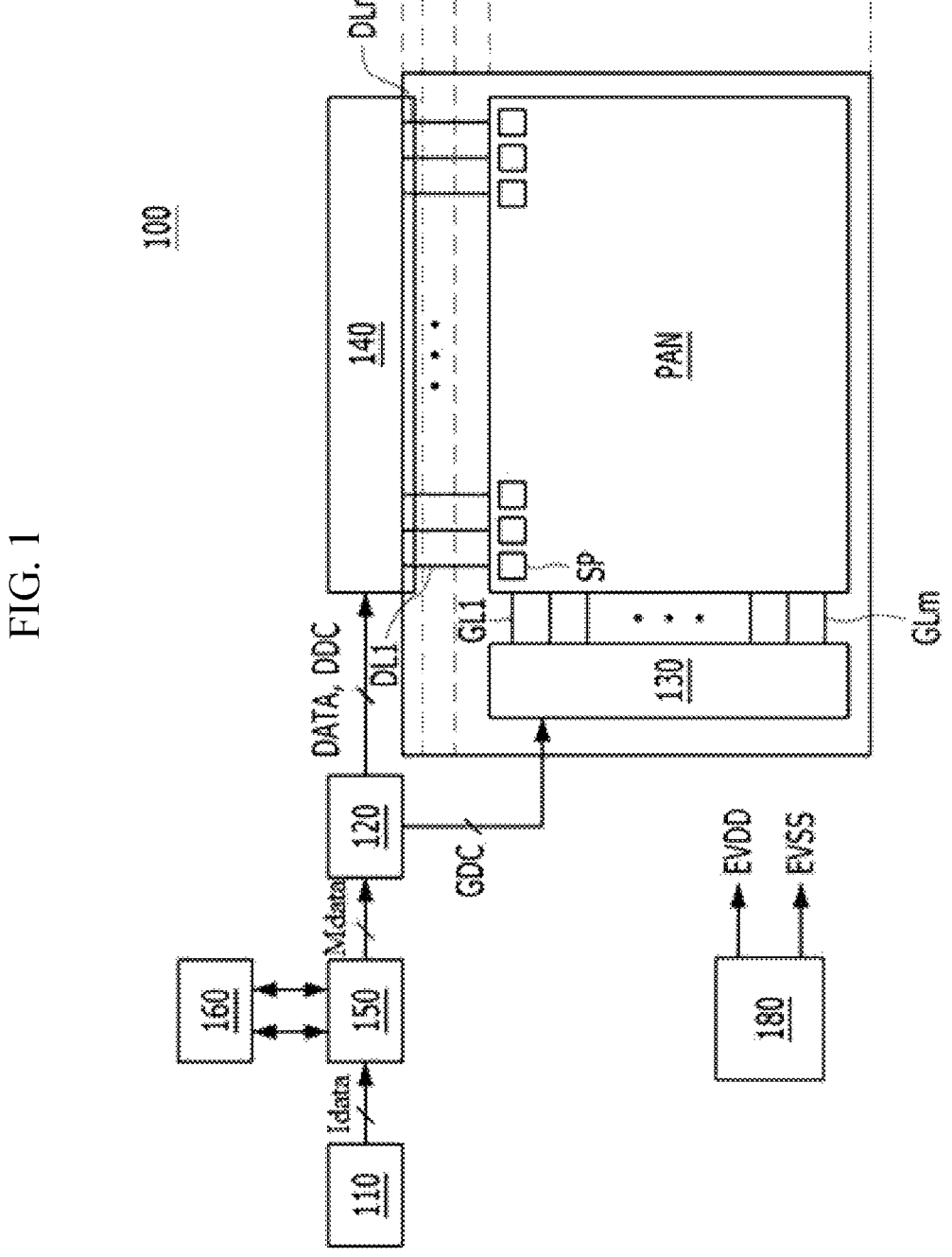
FIG. 1 is a schematic block diagram of a display device according to an exemplary aspect of the present disclosure.

Advantages and features of the present disclosure and methods for achieving the same will be made clear from embodiments described below in detail with reference to the accompanying drawings. The present disclosure may, however, be embodied in many different forms, and should not be construed as being limited to the embodiments set forth herein. Rather, these embodiments are provided so that this disclosure will be thorough and complete, and will fully convey the scope of the disclosure to those skilled in the art.

In the drawings for explaining the exemplary embodiments of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises", "includes", and/or "has", used in this specification, do not preclude the presence or addition of other elements unless used along with the term "only". The singular forms are intended to include the plural forms as well, unless the context clearly indicates otherwise.

In the interpretation of constituent elements included in the various embodiments of the present disclosure, the constituent elements are interpreted as including an error range even if there is no explicit description thereof.

In the description of the various embodiments of the present disclosure, when describing positional relationships, for example, when the positional relationship between two parts is described using "on", "above", "below", "next to", or the like, one or more other parts may be located between the two parts unless the term "directly" or "closely" is used.

In the description of the various embodiments of the present disclosure, when describing temporal relationships, for example, when the temporal relationship between two actions is described using "after", "subsequently", "next", "before", or the like, the actions may not occur in succession unless the term "directly" or "just" is used therewith.

It may be understood that, although the terms "first", "second", etc. may be used herein to describe various elements, these elements are not to be limited by these terms. These terms are merely used to distinguish one element from another. Therefore, in the present specification, an element indicated by "first" may be the same as an element indicated by "second" without exceeding the technical scope of the present disclosure, unless mentioned otherwise.

The respective features of the various embodiments of the present disclosure may be partially or wholly coupled to and combined with each other, and various technical linkages and modes of operation thereof are possible. These various embodiments may be performed independently of each other, or may be performed in association with each other.

Hereinafter, a display device according to an exemplary aspect of the present disclosure will be described in detail with reference to the accompanying drawings.

FIG. 1 is a schematic block diagram of a display device 100 according to the exemplary aspect of the present disclosure.

Figure 2:
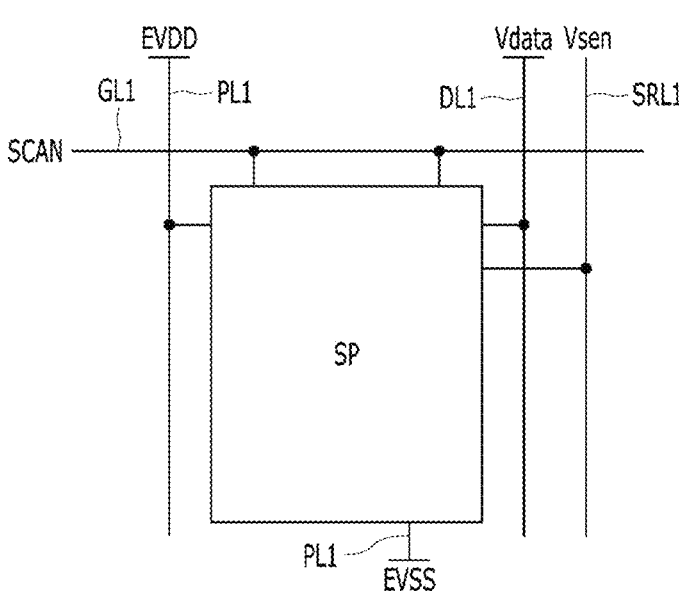
FIG. 2 is a schematic block diagram of a sub-pixel of the display device according to the exemplary aspect of the present disclosure.

FIG. 2 is a schematic block diagram of a sub-pixel SP shown in FIG. 1.

As shown in FIG. 1, the display device 100 includes an image processor 110, a degradation compensator 150, a memory 160, a timing controller 120, a data driver 140, a power supply 180, a gate driver 130, and a display panel PAN formed with the gate driver 130 therein. In particular, a non-active area NA of the display panel PAN includes a bending area BA. The display panel PAN may be folded in the bending area BA and, as such, a bezel thereof may be reduced.

The image processor 110 outputs drive signals for driving various devices, together with image data supplied from an exterior thereof.

The degradation compensator 150 modulates input image data Idata of each sub-pixel SP of a current frame based on a sensing voltage Vsen supplied from the data driver 140, and then supplies the modulated image data, that is, data Mdata, to the timing controller 120.

The timing controller 120 generates and outputs a gate timing control signal GDC for control of operation timing of the gate driver 130 and a data timing control signal DDC for control of operation timing of the data driver 140 based on a drive signal input from the image processor 110 thereto.

The gate driver 130 outputs a scan signal to the display panel PAN in response to the gate timing control signal GDC supplied from the timing controller 120. The gate driver 130 outputs the scan signal through a plurality of gate lines GL1 to GLm. In particular, the gate driver 130 may be configured to have a gate-in-panel (GIP) structure in which a thin film transistor is stacked on a substrate in the display device 100 which may be an organic electroluminescent display device. The GIP structure may include a plurality of circuits such as a shift register, a level shifter, etc.

The data driver 140 outputs a data voltage to the display panel PAN in response to the data timing control signal DDC input from the timing controller 120 thereto. The data driver 140 outputs the data voltage through a plurality of data lines DL1 to DLn.

The power supply 180 outputs a high-level drive voltage EVDD, a low-level drive voltage EVSS, etc., and supplies the output voltages EVDD, EVSS, etc. to the display panel PAN. The high-level drive voltage EVDD and the low-level drive voltage EVSS are supplied to the display panel PAN through power lines.

The display panel PAN displays an image, corresponding to the data voltage and the scan signal respectively supplied from the data driver 140 and the gate driver 130, which may be disposed in the non-active area NA, and power supplied from the power supply 180.

An active area AA of the display panel PAN is constituted by a plurality of sub-pixels SP and, as such, displays an actual image. The sub-pixels SP include a red (R) sub-pixel, a green (G) sub-pixel, and a blue (B) sub-pixel, or include a white (W) sub-pixel, a red (R) sub-pixel, a green (G) sub-pixel, and a blue (B) sub-pixel. In this case, the W, R, G, and B sub-pixels SP may be formed to have the same area or may be formed to have different areas, respectively.

The memory 160 stores a look-up table for degradation compensation gains, and a degradation compensation time point of an organic light emitting element of each sub-pixel SP. In this case, the degradation compensation time point of the organic light emitting element may be the number of times when an organic light emitting display panel is driven or the time for which the organic light emitting display panel is driven.

Meanwhile, as shown in FIG. 2, each sub-pixel SP may be connected to one gate line, for example, the gate line GL1, one data line, for example, the data line DL1, one sensing voltage read-out line, for example, a sensing voltage read-out line SRL1, and one power line, for example, a power line PL1. The numbers of transistors and capacitors of the sub-pixel SP and the driving method of the sub-pixel SP are determined in accordance with a circuit configuration of the sub-pixel SP.

Figure 3:
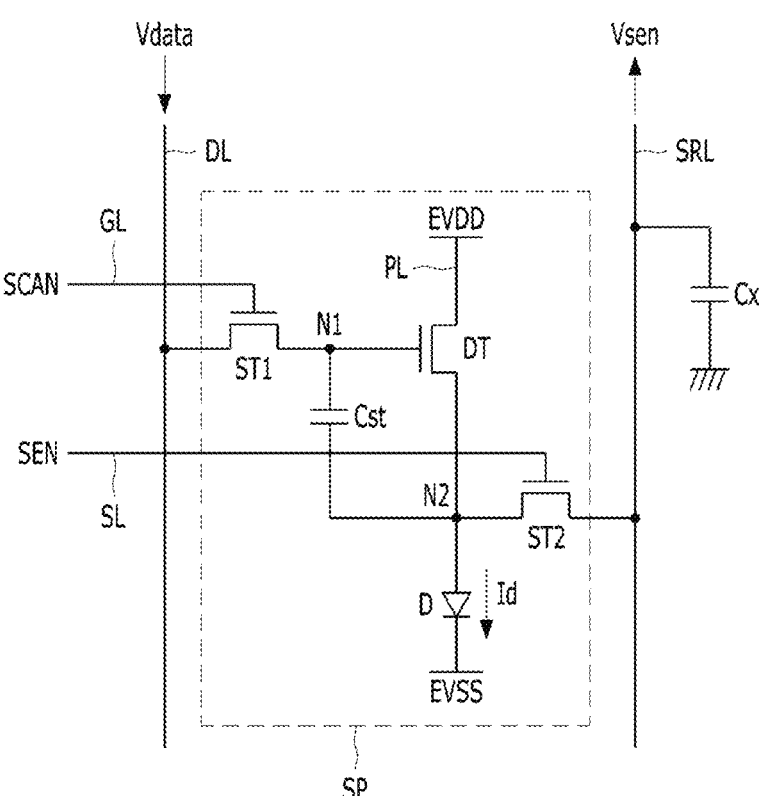
FIG. 3 is a circuit diagram of one sub-pixel of the display device according to the exemplary aspect of the present disclosure.

FIG. 3 is a circuit diagram of one sub-pixel SP of the display device 100 according to the exemplary aspect of the present disclosure.

As shown in FIG. 3, the display device 100 according to the exemplary aspect of the present disclosure includes a gate line GL, a data line DL, a power line PL, and a sensing line SL intersecting one another, thereby defining a sub-pixel SP, and includes a driving thin film transistor DT, a light emitting element D, a storage capacitor Cst, a first switching thin film transistor ST1, and a second switching thin film transistor ST2 at the sub-pixel SP.

The light emitting element D may include an anode connected to a second node N2, a cathode connected to an input terminal for a low-level drive voltage EVSS, and an organic light emitting layer disposed between the anode and the cathode.

The driving thin film transistor DT controls current Id flowing through the light emitting element D in accordance with a gate-source voltage Vgs thereof The driving thin film transistor DT includes a gate electrode connected to a first node N1, a drain electrode connected to the power line PL to receive a high-level drive voltage EVDD, and a source electrode connected to the second node N2.

The storage capacitor Cst is connected between the first node N1 and the second node N2.

When the display panel PAN is driven, the first switching thin film transistor ST1 applies a data voltage Vdata charged in the data line DL to the first node N1 in response to a scan signal SCAN, thereby turning on the driving thin film transistor DT. In this case, the first switching thin film transistor ST1 includes a gate electrode connected to the gate line GL to receive the scan signal SCAN, a drain electrode connected to the data line DL to receive the data voltage Vdata, and a source electrode connected to the first node N1. The first switching thin film transistor ST1 is more sensitive than other switching thin film transistors in the pixel. To this end, it is necessary to increase a threshold voltage of the first switching thin film transistor ST1 for easy control of the first switching thin film transistor ST1.

The second switching thin film transistor ST2 stores a source voltage of the second node N2 in a sensing capacitor Cx of a sensing voltage read-out line SRL by switching current between the second node N2 and the sensing voltage read-out line SRL in response to a sensing signal SEN. The second switching thin film transistor ST2 resets a source voltage of the driving thin film transistor DT to an initialization voltage Vpre by switching current between the second node N2 and the sensing voltage read-out line SRL in response to the sensing signal SEN when the display panel PAN is driven. In this case, in the second switching thin film transistor ST2, a gate electrode thereof is connected to the sensing line SL, a drain electrode thereof is connected to the second node N2, and a source electrode thereof is connected to the sensing voltage read-out line SRL.

In some aspects, a display device illustrated in FIG. 3 may be referred to as a 3T1C structure including three thin film transistors and one storage capacitor. In other aspects, the display device of the present disclosure may be applied to various pixel structures such as 4T1C, 5T1C, 6T1C, 7T1C, and 8T1C without being limited to the above-described structure.

Figure 4A:
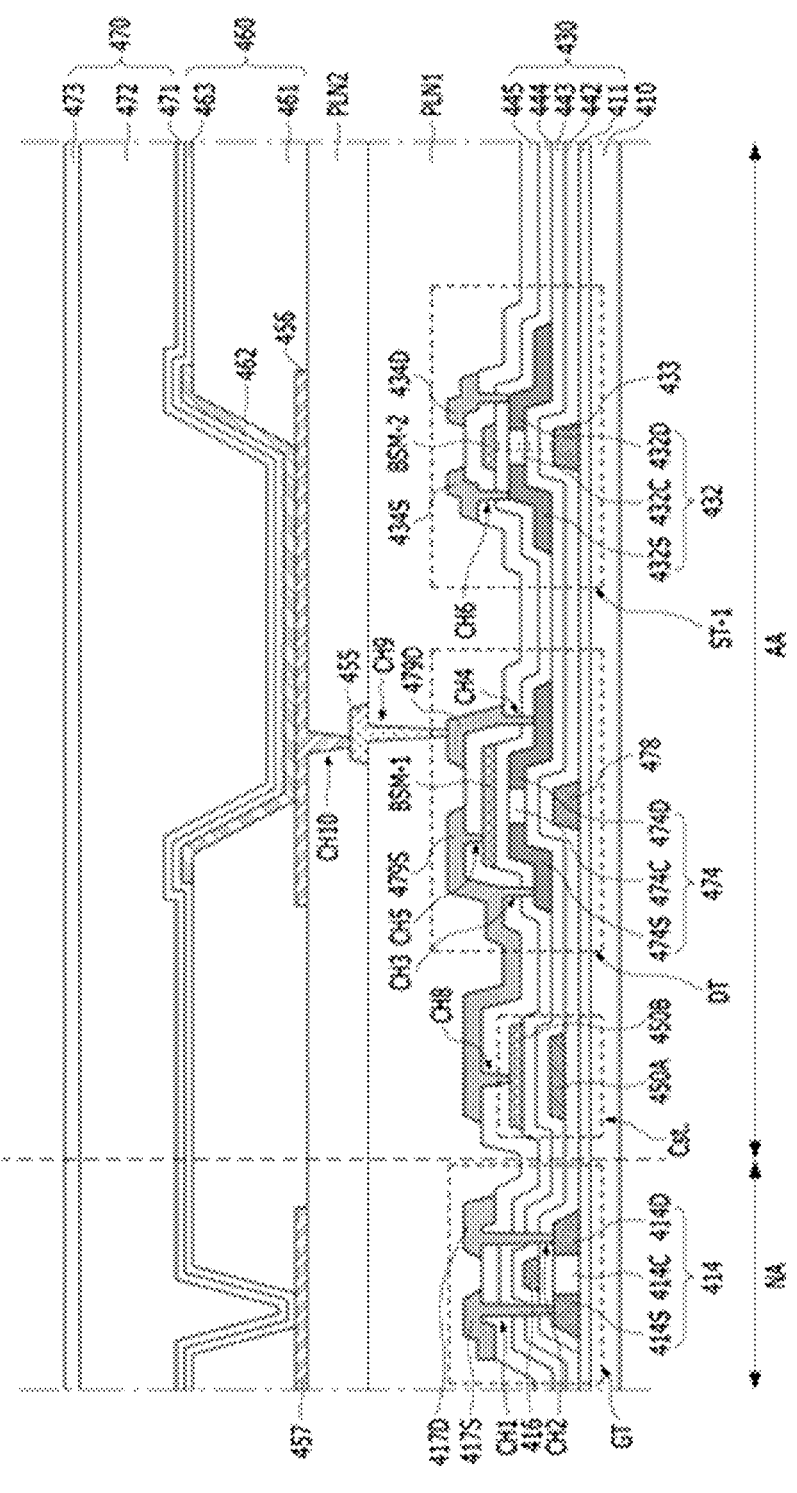
FIG. 4A is a cross-sectional view showing one thin film transistor disposed at a gate driving circuit part in a non-active area, a driving thin film transistor and a switching thin film transistor each disposed in an active area while including a gate electrode constituted by an oxide semiconductor pattern, and a storage capacitor in accordance with a first aspect of the present disclosure.

FIG. 4A is a cross-sectional view showing one thin film transistor GT for a gate driving circuit, which is a representative thin film transistor disposed in a non-active area NA, in particular, a GIP area. In FIG. 4A, cross-sectional view also includes a polycrystalline semiconductor pattern, a driving thin film transistor DT disposed in a sub-pixel in an active area AA with an oxide semiconductor pattern configured to drive a light emitting element, a first switching thin film transistor ST-1 with an oxide semiconductor pattern, and a storage capacitor Cst in accordance with an aspect of the present disclosure.

As shown in FIG. 4A, the driving thin film transistor DT and the first switching thin film transistor ST-1 are disposed in a sub-pixel on a substrate 410. Although the driving thin film transistor DT and only one switching thin film transistor ST-1 are illustrated in FIG. 4A, this illustration is only for convenience of description, and a plurality of switching thin film transistors may be disposed on the substrate 410.

In addition, a plurality of thin film transistors GT for a gate driving circuit constituting a gate driver may be disposed in the non-active area NA on the substrate 410, in particular, the GIP area. The thin film transistor GT for the gate driving circuit, which will be referred to as a "gate driving thin film transistor GT", may use a polycrystalline semiconductor pattern as an active layer.

Although the case in which the gate driving thin film transistor GT including the polycrystalline semiconductor pattern is disposed in the non-active area NA is described in the aspect, a switching thin film transistor having the same structure as that of the gate driving thin film transistor GT may be disposed in the sub-pixel.

Of course, the gate driving thin film transistor GT disposed in the non-active area NA and the switching thin film transistor disposed in the active area AA may have different configurations, such as an N-type thin film transistor and a P-type thin film transistor, because kinds of impurities implemented therein are different.

Meanwhile, the plurality of thin film transistors disposed in the gate driver may constitute a complementary metal oxide semiconductor (CMOS) configuration in which a thin film transistor for a gate driving circuit including a polycrystalline semiconductor pattern and a switching thin film transistor including an oxide semiconductor pattern are paired.

The following description will be given in conjunction with an example in which a thin film transistor for a gate driving circuit using a polycrystalline semiconductor pattern as an active layer thereof is disposed in the non-active area NA.

The gate driving thin film transistor GT includes a polycrystalline semiconductor pattern 414 disposed on a lower buffer layer 411 formed on the substrate 410, a first gate insulating layer 442 configured to insulate the polycrystalline semiconductor pattern 414, a first gate electrode 416 disposed on the first gate insulating layer 442 while overlapping with the polycrystalline semiconductor pattern 414, a plurality of insulating layers formed on the first gate electrode 416, and a first source electrode 417S and a first drain electrode 417D disposed on the plurality of insulating layers.

The substrate 410 may be a multilayer structure in which an organic layer and an inorganic layer are alternately stacked. For example, the substrate 410 may have a multilayer structure in which an organic layer of, for example, polyimide, and an inorganic layer of, for example, silicon oxide ($SiO_2$), are alternately stacked.

The lower buffer layer 411 is formed on the substrate 410. The lower buffer layer 411 prevents moisture, etc. from penetrating from the outside. The lower buffer layer 411 may be formed by depositing at least layer of an an inorganic insulating material, for example, silicon oxide ($SiO_2$).

The polycrystalline semiconductor pattern 414 is formed on the lower buffer layer 411. The polycrystalline semiconductor pattern 414 is the active layer of the thin film transistor. The polycrystalline semiconductor pattern 414 includes a first channel region 414C, and a first source region 414S and a first drain region 414D facing each other under the condition that the first channel region 414C is interposed therebetween.

The polycrystalline semiconductor pattern 414 is insulated by the first gate insulating layer 442. The first gate insulating layer 442 is formed by depositing at least one layer of an inorganic insulating material, for example, silicon oxide ($SiO_2$), on the entire surface of the substrate 410 having the polycrystalline semiconductor pattern 414. The first gate insulating layer 442 protects and insulates the polycrystalline semiconductor pattern 414 from the outside.

The first gate electrode 416 overlapping with the first channel region 414C of the polycrystalline semiconductor pattern 414 is formed on the first gate insulating layer 442.

The first gate electrode 416 may be made of a metal material. For example, the first gate electrode 416 may take the form of a single layer or multiple layers made of one of molybdenum (Mo), aluminum (Al), chromium (Cr), gold (Au), titanium (Ti), nickel (Ni), neodymium (Nd), and copper (Cu) or an alloy thereof, without being limited thereto.

A plurality of insulating layers may be formed between the first gate electrode 416 and the first source electrode 417S and the first drain electrode 417D.

Referring to FIG. 4A, the plurality of insulating layers may include an upper buffer layer 443 contacting an upper surface of the first gate electrode 416, and a second interlayer insulating layer 444 and a third interlayer insulating layer 445 sequentially stacked on the upper buffer layer 443.

The first source electrode 417S and the first drain electrode 417D are disposed on the third interlayer insulating layer 445. The first source electrode 417S and the first drain electrode 417D are connected to the polycrystalline semiconductor pattern 414 through a first contact hole CH1 and a second contact hole CH2, respectively. The first contact hole CH1 and the second contact hole CH2 extend through the first gate insulating layer 442, the upper buffer layer 443, the second interlayer insulating layer 444, and the third interlayer insulating layer 445, thereby exposing the first source region 414S and the first drain region 414D of the polycrystalline semiconductor pattern 414, respectively.

Meanwhile, the driving thin film transistor DT, the first switching thin film transistor ST-1, and the storage capacitor Cst are disposed at the sub-pixel in the active area AA.

In some aspects, each of the driving thin film transistor DT and the first switching thin film transistor ST-1 uses an oxide semiconductor material as an active layer.

The driving thin film transistor DT includes a first oxide semiconductor pattern 474, and a second gate electrode 478, a second source electrode 479S, and a second drain electrode 479D overlapping with the first oxide semiconductor pattern 474.

The oxide semiconductor may oxide including a metal such as zinc (Zn), indium (In), gallium (Ga), tin (Sn), titanium (Ti), or the like, or a combination of a metal such as zinc (Zn), indium (In), gallium (Ga), tin (Sn), titanium (Ti), or the like and an oxide thereof. More specifically, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), or the like.

In the illustrated aspect, a polycrystalline semiconductor pattern can be advantageous in terms of high-speed operation and may be an active layer of a driving thin film transistor. In the case of a driving thin film transistor including a polycrystalline semiconductor pattern, there may be leakage current that is generated in an off state of the driving thin film transistor, which increases power consumption. In particular, the generated leakage current in an off state of the driving thin film transistor may be severe when the display device is driven at a low speed to display a still image such as a document. To this end, in the aspect of the present disclosure, a driving thin film transistor having, as an active layer, an oxide semiconductor pattern advantageous in preventing generation of leakage current is disclosed.

In some cases, when the thin film transistor uses an oxide semiconductor pattern as an active layer, a current fluctuation value with respect to a voltage fluctuation value may be increased due to characteristics of an oxide semiconductor material and, as such, failure may frequently occur in a low-grayscale range in which precise current control is required. Therefore, in accordance with the aspect of the present disclosure, a driving thin film transistor in which fluctuation in current is relatively insensitive to fluctuation in a voltage applied to a gate electrode is disclosed.

Figure 4B:
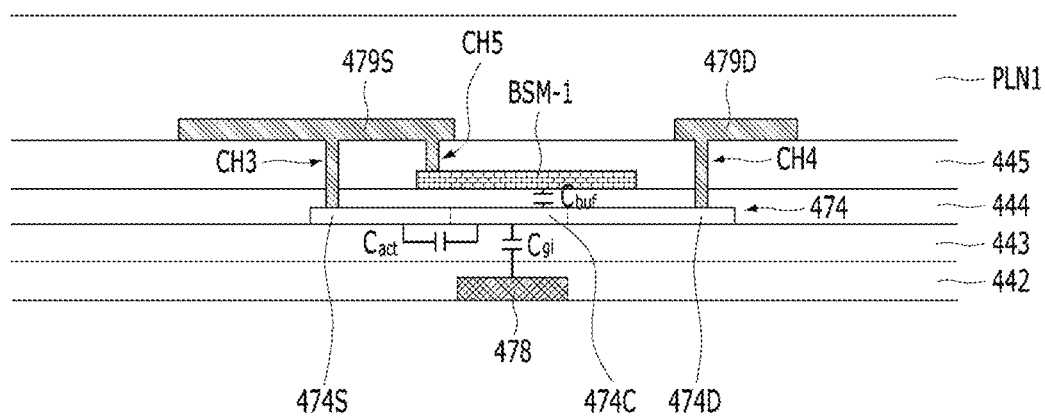
FIG. 4B is an enlarged cross-sectional view in which only the driving thin film transistor shown in FIG. 4A is enlarged.
Figure 4C:
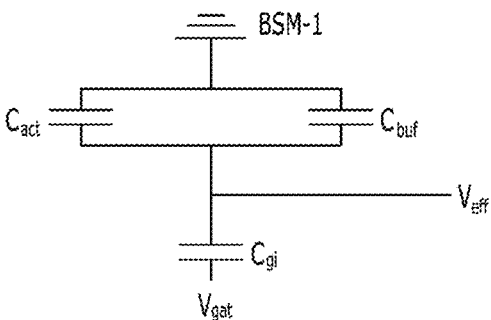
FIG. 4C is a circuit diagram showing a relation among parasitic capacitances generated in the configuration of FIG. 4B.

A structure of the driving thin film transistor will be described with reference to FIGS. 4A to 4C. FIG. 4B is an enlarged cross-sectional view in which only the driving thin film transistor DT shown in FIG. 4A is enlarged. FIG. 4C is a circuit diagram showing a relation among parasitic capacitances generated in the driving thin film transistor DT.

The driving thin film transistor DT includes the first oxide semiconductor pattern 474 disposed on the upper buffer layer 443, the second gate electrode 478 disposed under the first oxide semiconductor pattern 474 and overlapping with the first oxide semiconductor pattern 474, the second interlayer insulating layer 444 covering the first oxide semiconductor pattern 474, a first light shielding pattern BSM-1 formed on the second interlayer insulating layer 444 and overlapping with the first oxide semiconductor pattern 474, the third interlayer insulating layer 445, which covers the first light shielding pattern BSM-1, and the second source electrode 479S and the second drain electrode 479D, which are disposed on the third interlayer insulating layer 445.

In one aspect, the second gate electrode 478 may include a semiconductor material layer treated to have conductivity. For example, the second gate electrode 478 may be formed by doping a semiconductor material layer with impurity ions to have conductivity, and then patterning the semiconductor material layer.

In one aspect, the semiconductor material layer may be treated to have conductivity by implanting P-type impurity ions such as boron ions in a semiconductor material.

In addition, although the second gate electrode 478 is constituted by a semiconductor material layer treated to have conductivity while having a single-layer structure, as shown in FIG. 4A, the second gate electrode 478 may be a multilayer structure comprising sequential layers of a conductive material layer such as a metal pattern and a semiconductor material layer treated to have conductivity.

Generally, an oxide semiconductor is an N-type semiconductor material. In this regard, when P-type impurity ions are implemented in the second gate electrode 478 disposed under the first oxide semiconductor pattern 474, which has N-type conductivity, thereby causing the second gate electrode 478 to have a P-type semiconductor pattern, the Fermi-level of the second gate electrode 478 is lowered. In addition, the Fermi-level of the first oxide semiconductor pattern 474 is also lowered to achieve a Fermi-level balance in a thermal equilibrium state. Accordingly, the threshold voltage of the driving thin film transistor DT using the first oxide semiconductor pattern 474 as an active layer is increased.

Conversely, when the second gate electrode 478 is formed into a gate electrode including an N-type semiconductor pattern by implementing N-type impurity ions in the second gate electrode 478, the threshold voltage of the driving thin film transistor DT is lowered. In this aspect, the threshold voltage of the driving thin film transistor DT may be increased by virtue of the second gate electrode 478, which includes a P-type semiconductor material layer, using the above-described principle.

The semiconductor material layer included in the second gate electrode 478 may be various kinds of semiconductor material layers made of an amorphous semiconductor material, a polycrystalline semiconductor material, an oxide semiconductor material, etc.

The driving thin film transistor DT requires a very high threshold voltage in terms of design, as compared to other switching thin film transistors in the pixel. In one example, the switching thin film transistors have a threshold voltage approximate to 0 V, whereas the driving thin film transistor DT has a threshold voltage of 1 V or more. Accordingly, the driving thin film transistor DT according to the aspect of the present disclosure has an advantage in that an increase in threshold voltage may be achieved because the second gate electrode 478, which includes a semiconductor material layer doped with P-type impurity ions, is disposed under the first oxide semiconductor pattern 474.

In the aspect of the present disclosure referring to FIG. 4A, it may be possible to reduce the number of manufacturing processes as the second gate electrode 478 is disposed on the same layer as the polycrystalline semiconductor pattern 414 while including a semiconductor material layer. In the aspect of the present disclosure, accordingly, the second gate electrode 478 is a gate electrode doped with P-type impurity ions and can be formed with the same semiconductor material as the polycrystalline semiconductor pattern 414.

Figure 4D:
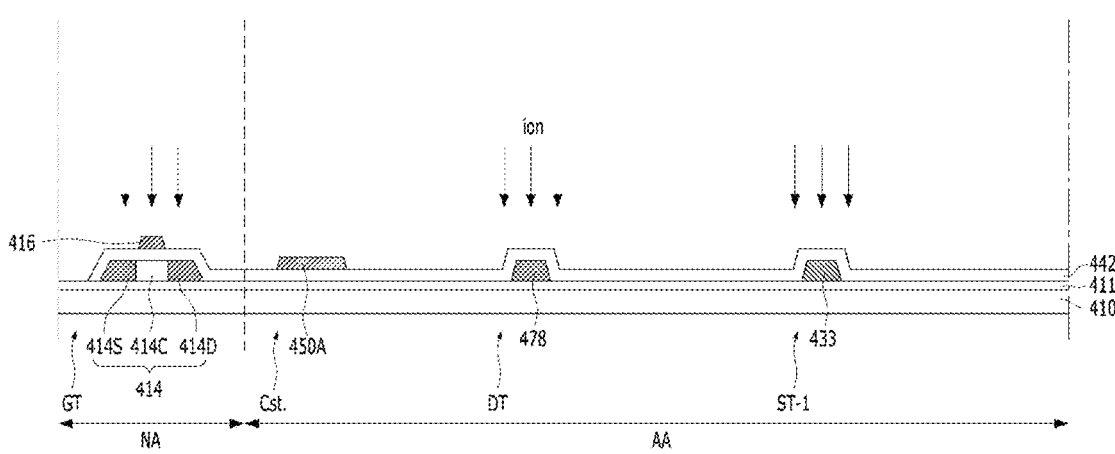
FIG. 4D is a cross-sectional view explaining a procedure in which a first gate electrode and a second gate electrode are treated to have conductivity in the aspect of the present disclosure.

FIG. 4D is a cross-sectional view explaining a procedure in which the second gate electrode 478, which has a single-layer structure constituted by a semiconductor material layer, is formed on the same layer as the polycrystalline semiconductor pattern 414 simultaneously with the polycrystalline semiconductor pattern 414 and is treated to have conductivity.

Referring to FIG. 4D, a polycrystalline semiconductor layer is deposited on the lower buffer layer 411, and the polycrystalline semiconductor pattern 414, the second gate electrode 478, and a third gate electrode 433, which are formed by a polycrystalline semiconductor material, are then formed. After forming the structures with the polycrystalline semiconductor material, the first gate insulating layer 442 is deposited over the entire surface of the substrate 410, and a metal material layer is then deposited on the first gate insulating layer 442. Through patterning of the metal material layer, the first gate electrode 416 and a first electrode 450A of a storage capacitor are then formed. Thereafter, the first source region 414S and the first drain region 414D are treated to have conductivity, using the first gate electrode 416 as a self-alignment mask for ion implantation. At the same time, the second gate electrode 478 and the third gate electrode 433 formed by the polycrystalline semiconductor material are treated to have conductivity. In this regard, the gate-driving thin film transistor GT in the aspect may be a P-type thin film transistor.

In another aspect, the second gate electrode 478 may be constituted by a stack structure in which a metal pattern layer and a semiconductor material layer are stacked, in place of a single-layer structure constituted by a semiconductor material layer.

Figure 5:
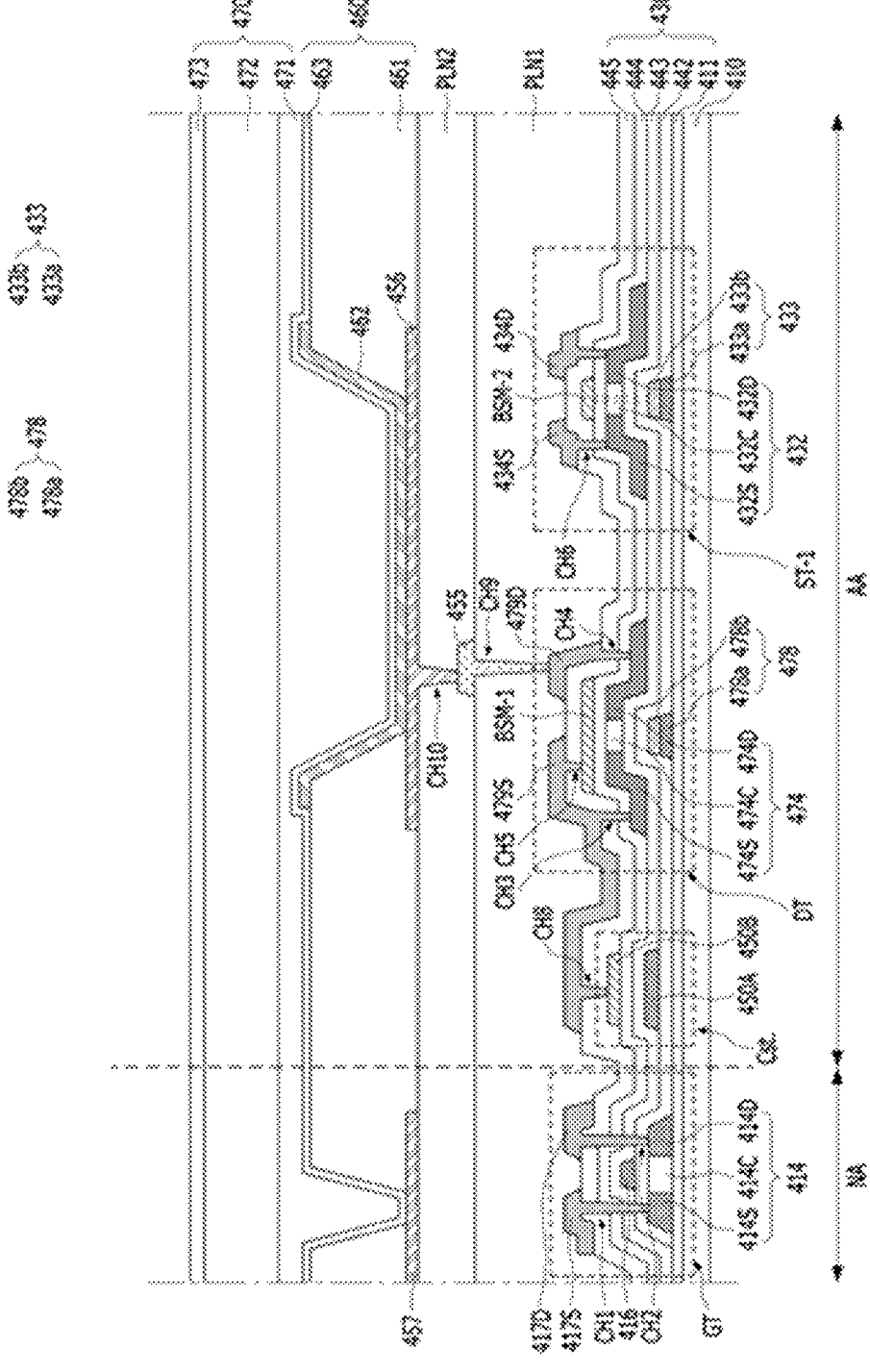
FIG. 5 is a cross-sectional view showing one thin film transistor disposed at a gate driving circuit part in a non-active area, a driving thin film transistor and a switching thin film transistor each disposed in an active area while including a gate electrode having a stack structure of a metal material layer and a semiconductor material layer, and a storage capacitor in accordance with a second aspect of the present disclosure.

Referring to FIG. 5, the second gate electrode 478 may have a stack structure in which a first layer 478a constituted by a metal pattern and a second layer 478b constituted by a semiconductor material layer are stacked.

Although the second gate electrode 478 has a stack structure of the first layer 478a constituted by the metal pattern and the second layer 478b constituted by the semiconductor material layer, it may be possible to simultaneously form the second gate electrode 478 on the same layer as the polycrystalline semiconductor pattern 414 when a half-tone mask is used.

For reference, and for convenience of description, the first light shielding pattern BSM-1 is shown as having a single-layer structure of a metal pattern in FIGS. 4A and 5, even though the first light shielding pattern BSM-1 has a stack structure of a semiconductor material layer and a metal pattern.

Meanwhile, the first light shielding pattern BSM-1 is formed over the first oxide semiconductor pattern 474. The first light shielding pattern BSM-1 prevents light incident from the outside from irradiating the first oxide semiconductor pattern 474, thereby preventing the first oxide semiconductor pattern 474, which is sensitive to external light, from malfunctioning.

The first light shielding pattern BSM-1 is disposed to overlap with a portion of the first oxide semiconductor pattern 474 while being disposed on the first oxide semiconductor pattern 474. In addition, the first light shielding pattern BSM-1 is electrically connected to one of the second source electrode 479S and the second drain electrode 479D.

The first light shielding pattern BSM-1 protects the first oxide semiconductor pattern 474 from hydrogen particles, which may be introduced from an upper side over the first oxide semiconductor pattern 474. Accordingly, the first light shielding pattern BSM-1 may include titanium (Ti) having a hydrogen particle collection ability. For example, the first light shielding pattern BSM-1 may be a single layer of titanium (Ti), a double layer of molybdenum (Mo) and titanium (Ti), or a layer of an alloy of molybdenum (Mo) and titanium (Ti). However, the aspect of the present disclosure is not limited to the above-described condition, and other metal layers including titanium (Ti) may also be used.

When the first light shielding pattern BSM-1 is connected to one of the second source electrode 479S and the second drain electrode 479D, the following additional effect may be obtained (for convenience of description, the following description will be given in conjunction with the case in which the first light shielding pattern BSM-1 is connected to the second source electrode 479S).

This will be described with reference to FIGS. 4B and 4C.

FIG. 4B is a cross-sectional view showing only the thin film transistor DT separated from FIG. 4A. FIG. 4C is a circuit diagram showing a relation between a parasitic capacitance generated at the driving thin film transistor DT and a voltage applied to the driving thin film transistor DT.

Referring to FIG. 4B, when the second source region 474S and the second drain region 474D of the first oxide semiconductor pattern 474 become conductive, a parasitic capacitance $C_{act}$ is generated based on the channel 474C of the first oxide semiconductor pattern 474. In addition, a parasitic capacitance $C_{gi}$ is generated between the second gate electrode 478 and the first oxide semiconductor pattern 474. In addition, a parasitic capacitance $C_{buf}$ is generated between the first light shielding pattern BSM-1 and the first oxide semiconductor pattern 474.

Since the first oxide semiconductor pattern 474 and the first light shielding pattern BSM-1 are electrically interconnected by the second source electrode 479S, the parasitic capacitance $C_{act}$ and the parasitic capacitance $C_{buf}$ are connected in parallel, and the parasitic capacitance $C_{act}$ and the parasitic capacitance $C_{gi}$ are connected in series. In addition, when a gate voltage of $V_{gat}$ is applied to the second gate electrode 478, an effective voltage $V_{eff}$ actually applied to the first oxide semiconductor pattern 474 corresponds to equation 1 below.

$$\Delta V_{\text{eff}} = \frac{C_{gi}}{C_{gi} + C_{buf} + C_{act}} * \Delta V_{gat} \qquad \text{(Equation 1)}$$

Thus, the effective voltage $V_{\text{eff}}$ applied to a channel 474C of the first oxide semiconductor pattern 474 is inversely proportional to the parasitic capacitance $C_{buf}$ and, as such, it may be possible to adjust the effective voltage $V_{\text{eff}}$ applied to the first oxide semiconductor pattern 474 by adjusting the parasitic capacitance $C_{buf}$.

That is, when the first light shielding pattern BSM-1 is disposed near the first oxide semiconductor pattern 474, to increase the parasitic capacitance $C_{buf}$, it may be possible to reduce an actual value of current flowing through the first oxide semiconductor pattern 474.

Reduction in the effective value of current flowing through the first oxide semiconductor pattern 474 may increase a control range of the driving thin film transistor DT, which is controllable through the voltage $V_{gat}$ applied to the second gate electrode 478. In addition, reducing the current also increases in s-factor. In some aspects, the s-factor is a reciprocal value of a current variation to a gate voltage variation in an on/off transition period of a thin film transistor.

Accordingly, in the aspect of the present disclosure, when the first light shielding pattern BSM-1 is disposed nearer to the first oxide semiconductor pattern 474, a grayscale control range of the driving thin film transistor DT may be increased. As a result, it may be possible to accurately control the light emitting element even at low gray levels and, as such, to address a Mura defect that is frequently generate dat low gray levels.

In this aspect, accordingly, the parasitic capacitance $C_{buf}$ may be greater than the parasitic capacitance $C_{gi}$.

Thus, in accordance with the aspect of the present disclosure, a driving thin film transistor may be capable of achieving free grayscale expression even at low gray levels by virtue of the first light shielding pattern BSM-1. In addition, a driving thin film transistor may have an increased threshold voltage by virtue of the second gate electrode 478 treated to have P-type conductivity.

Heretofore, advantages that may be obtained when the first light shielding pattern BSM-1 is a metal pattern and is electrically connected to the second source electrode 479S have been described with reference to FIGS. 4A and 5.

Figure 6:
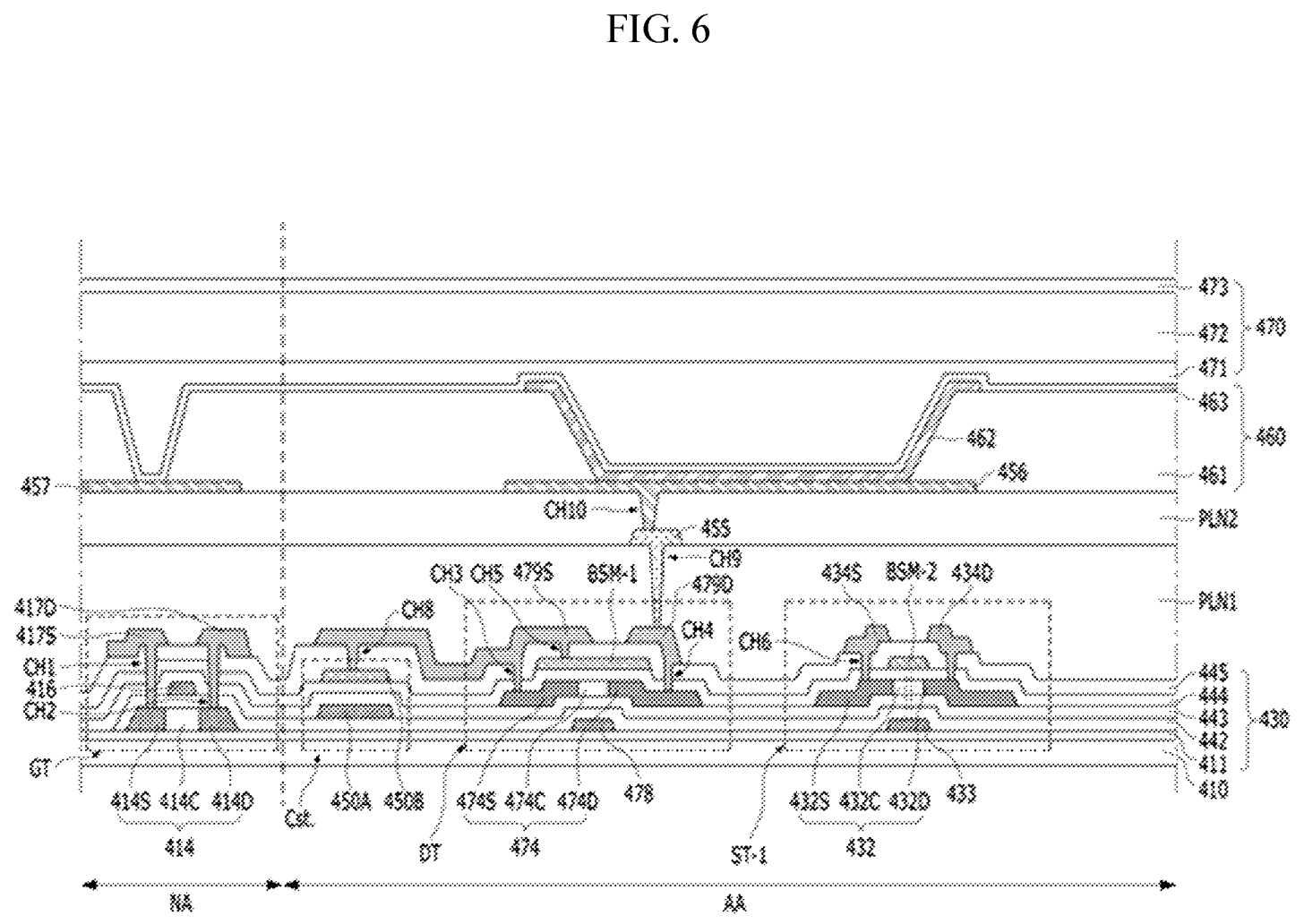

In some aspects, even when the first light shielding pattern BSM-1 is not a metal pattern and is a semiconductor material layer having conductivity through doping thereof with impurity ions in accordance with another aspect, as shown in FIG. 6, the same effects as those of the above-described case may be obtained.

FIG. 6 shows the case in which the first light shielding pattern BSM-1 is a semiconductor material layer treated to have conductivity. In addition to the first light shielding pattern BSM-1, each of a second light shielding pattern BSM-2 and a second electrode 450B of the storage capacitor may also be a semiconductor material layer treated to have conductivity.

In some aspects, when the first light shielding pattern BSM-1 is a semiconductor material layer treated to have P-type conductivity, the Fermi level of the first light shielding pattern BSM-1 is lowered, and the Fermi level of the first oxide semiconductor pattern 474 corresponding to the first light shielding pattern BSM-1 is also lowered to achieve balance of Fermi levels in a thermal equilibrium state. As a result, the threshold voltage for turning on the first switching thin film transistor may be increased.

Figure 7:
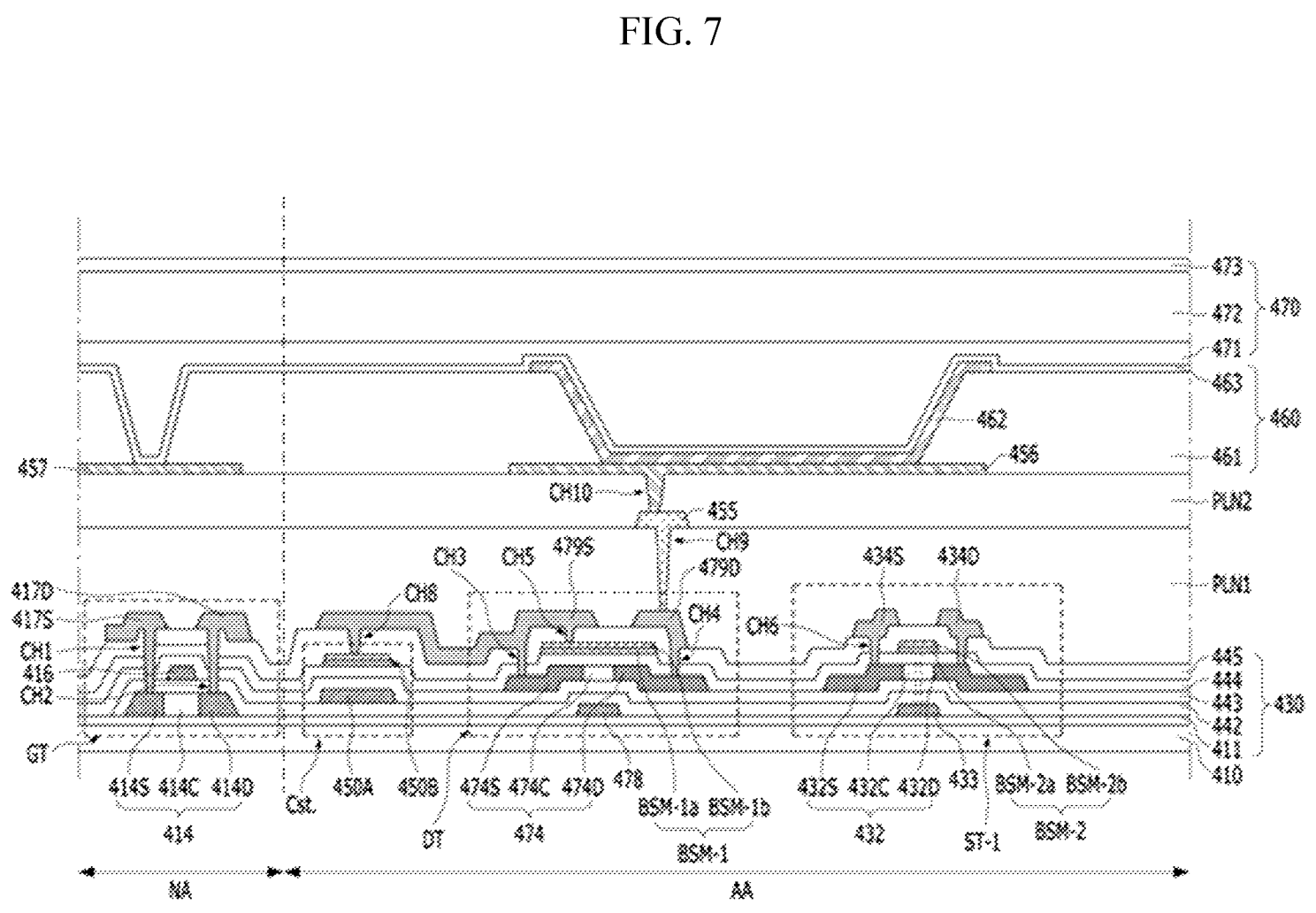

Although the first light shielding pattern BSM-1 shown in FIG. 6 is shown as having a single-layer structure of a semiconductor material layer, the first light shielding pattern BSM-1 may have a stack structure of a metal material layer and a semiconductor material layer, referring to FIG. 7. When the first light shielding pattern BSM-1 is comprises a plurality of layers, the first light shield pattern BSM-1 may have a structure in which a first layer BSM-1*a* constituted by a semiconductor material layer, and a second layer BSM-1*b* constituted by a metal material are sequentially stacked in this order such that the semiconductor material is disposed near the first oxide semiconductor pattern 474.

Referring to FIG. 7, the second light shielding pattern BSM-2 and the second electrode 450B of the storage capacitor, which are formed on the same layer as the first light shielding pattern BSM-1, using the same material as that of the first light shielding pattern BSM-1, may have a configuration in which a semiconductor material layer and a metal material layer are sequentially stacked in this order.

In addition, referring to FIG. 7, when each of the second gate electrode 478 and the third gate electrode 433 having a single layer of a metal material, the second gate electrode 478 and the third gate electrode 433 may be formed on the same layer as the first gate electrode 416 with the same material of the first gate electrode 416, thereby reducing the number of mask processes.

Referring to FIG. 4A, the first switching thin film transistor ST-1 includes a second oxide semiconductor pattern 432 formed on the upper buffer layer 443, a third gate electrode 433 disposed under the second oxide semiconductor pattern 432, the second light shielding pattern BSM-2 disposed over the second oxide semiconductor pattern 432, the second interlayer insulating layer 444 interposed between the second oxide semiconductor pattern 432 and the second light shielding pattern BSM-2, the third interlayer insulating layer 445 covering the second light shielding pattern BSM-2, and a third source electrode 434S and a third drain electrode 434D formed on the third interlayer insulating layer 445.

The second oxide semiconductor pattern 432 includes a third channel region 432C, and a third source region 432S and a third drain region 432D disposed at opposite sides of the third channel region 432C, respectively.

The third source electrode 434S and the third drain electrode 434D may be connected to the third source region 432S and the third drain region 432D via a sixth contact hole CH6 and a seventh contact hole CH7, respectively.

In particular, the third gate electrode 433 and the second light shielding pattern BSM-2 are disposed under and over the second oxide semiconductor pattern 432, respectively, and, as such, protect the oxide semiconductor pattern from light incident thereupon and increase the threshold voltage of the first switching thin film transistor ST-1.

The third gate electrode 433 may include a semiconductor material layer treated to have P-type conductivity. Accordingly, as the third gate electrode 433 becomes conductive in accordance with implementation of P-type impurity ions therein and lowers the Fermi level. In addition, the Fermi level of the second oxide semiconductor pattern 432 corresponding to the third gate electrode 433 is also lowered. As a result, the threshold voltage of the first switching thin film transistor ST-1 increases. In particular, referring to FIG. 3, when the first switching thin film transistor ST-1 is a sampling transistor connected to a gate node of the driving thin film transistor DT, improvements to a sampling transistor may be exhibited by increasing the threshold voltage as described below. The sampling transistor functions to provide a data voltage to one electrode of the storage capacitor during a sampling period.

The sampling transistor is sensitive and a channel is opened even at a low voltage. In the aspect of the present disclosure, since the third gate electrode 433, which includes the semiconductor material layer doped with P-type impurity ions, is disposed under the second oxide semiconductor pattern 432, the threshold voltage of the first switching thin film transistor ST-1 increases and, as such, there is an advantage in that freedom of an internal compensation circuit configuration to control the voltage may be enhanced.

In addition, referring to FIG. 5, the third gate electrode 433 may be a plurality of layers including a semiconductor material layer treated to have P-type conductivity. For example, the third gate electrode 433 may be configured to have a multilayer structure comprising a sequential stack of a first layer 433*a*, which is a conductive metal material layer, and a second layer 433*b*, which is a semiconductor material layer treated to have P-type conductivity.

In addition, the second light shielding pattern BSM-2 may also be a single-layer structure of a semiconductor material layer treated to have conductivity or a multilayer structure in which a semiconductor material layer treated to have conductivity and a conductive metal material layer are stacked. That is, referring to FIG. 6, the second light shielding pattern BSM-2 may have a single-layer structure of a semiconductor material layer treated to have conductivity, or may have a multilayer structure in which a first layer BSM-2*a* of a semiconductor material layer treated to have conductivity and a second layer BSM-2*b* of a conductive metal material layer are sequentially stacked, as shown in FIG. 7.

In some aspects, to lower the Fermi level of the second oxide semiconductor pattern 432, the third gate electrode 433 and the second light shielding pattern BSM-2 be stacked to be approximate to a depth of the second oxide semiconductor pattern 432. Accordingly, the third gate electrode 433 may have a configuration in which a metal material layer and a semiconductor material layer are sequentially stacked in this order, and the second light shielding pattern BSM-2 may have a configuration in which a semiconductor material layer and a metal material layer are sequentially stacked in this order.

Meanwhile, the third gate electrode 433 and the second light shielding pattern BSM-2 may be electrically interconnected and, as such, the first switching thin film transistor ST-1 may be a switching thin film transistor having a double gate structure.

In addition, the polycrystalline semiconductor pattern 414, the second gate electrode 478, and the third gate electrode 433 may be disposed on the same layer and, as such, there is an advantage in that the polycrystalline semiconductor pattern 414, the second gate electrode 478, and the third gate electrode 433 may be simultaneously formed using one mask and, as such, the number of mask processes may be reduced.

In addition, the first source electrode 4175, the first drain electrode 417D, the second source electrode 479S, the second drain electrode 479D, the third source electrode 434S, and the third drain electrode 434D may be disposed on the same layer. That is, all of the source electrodes and the drain electrodes may be disposed on the third interlayer insulating layer 445. Accordingly, the source electrodes and the drain electrodes may be simultaneously formed using one mask and, as such, the number of mask processes may be reduced.

Meanwhile, referring to FIG. 4A, the sub-pixel includes a storage capacitor Cst.

The storage capacitor Cst stores a data voltage applied thereto via a data line for a predetermined period, and then provides the stored data voltage to the organic light emitting element.

The storage capacitor Cst includes two electrodes corresponding to each other, and a dielectric disposed between the two electrodes. The storage capacitor Cst includes a first electrode 450A disposed on the same layer as the first gate electrode 416 and made of the same material as that of the first gate electrode 416, and a second electrode 450B disposed on the same layer as the first light shielding pattern BSM-1 and made of the same material as that of the first light shielding pattern BSM-1 while overlapping with the first electrode 450A.

The upper buffer layer 443 and the second interlayer insulating layer 444 may be interposed between the first electrode 450A and the second electrode 450B of the storage capacitor Cst.

The second electrode 450B of the storage capacitor Cst may be electrically connected to the second source electrode 479S via an eighth contact hole CH8.

Meanwhile, referring to FIG. 4A, a first planarization layer PLN1 may be formed over the substrate 410 on which the driving thin film transistor DT and the first switching thin film transistor ST-1 are disposed.

Although not shown, a passivation layer, which is an inorganic layer, may be further deposited before deposition of the first planarization layer PLN1.

Although the first planarization layer PLN1 may be formed of an organic material such as photoacryl, the first planarization layer PLN1 may also be a plurality of layers including an inorganic layer and an organic layer. A connection electrode 455 is formed over the first planarization layer PLN1. The connection electrode 455 electrically interconnects an anode 456, which is one constituent element of a light emitting device part 460, and the driving thin film transistor DT via a ninth contact hole CH9 formed in the first planarization layer PLN1.

In addition, a conductive layer used to form the connection electrode 455 may be a part of various link lines disposed in a bending area BA.

A second planarization layer PLN2 may be formed over the connection electrode 455. Although the second planarization layer PLN2 may be formed of an organic material such as photoacryl, the second planarization layer PLN2 may also be constituted by a plurality of layers constituted by an inorganic layer and an organic layer.

The anode 456 is formed over the second planarization layer PLN2. The anode 456 is electrically connected to the connection electrode 455 via a tenth contact hole CH10 formed in the second planarization layer PLN2.

The anode 456 may take the form of a single layer or multiple layers made of a metal such as Ca, Ba, Mg, Al, Ag, etc. or an alloy thereof. The anode 456 is connected to the second drain electrode 479D of the driving thin film transistor DT and, as such, an image signal from the outside is applied thereto.

In addition to the anode 456, an anode connection electrode 457, which electrically interconnects a common voltage line VSS and a cathode 463, may be further provided in a non-active area NA.

A bank layer 461 is formed over the second planarization layer PLN2. The bank layer 461 is a barrier and may partition sub-pixels to prevent light of particular colors output from adjacent sub-pixels from being output in a mixed state.

An organic light emitting layer 462 is formed on a surface of the anode 456 and a portion of an inclined surface of the bank layer 461. The organic light emitting layer 462 may be an R-organic light emitting layer configured to emit red light, a G-organic light emitting layer configured to emit green light, or a B-organic light emitting layer configured to emit blue light, which is formed at each sub-pixel. In addition, the organic light emitting layer 462 may be a W-organic light emitting layer configured to emit white light.

The organic light emitting layer 462 may include a light emitting layer, an electron injection layer, and a hole injection layer respectively configured to inject electrons and holes into the light emitting layer, an electron transportation layer and a hole transportation layer respectively configured to transport injected electrons and holes to an organic layer, etc.

The cathode 463 is formed over the organic light emitting layer 462. The cathode 463 may be made of a transparent conductive material such as indium tin oxide (ITO) or indium zinc oxide (IZO), or a thin metal allowing transmission of visible light therethrough, without being limited thereto.

An encapsulation layer part 470 is formed over the cathode 463. The encapsulation layer part 470 may be a single layer formed of an inorganic layer, a double layer of inorganic layer/organic layer, or a triple layer of inorganic layer/organic layer/inorganic layer. The inorganic layer may be constituted by an inorganic material such as $SiN_x$, SiX, or the like, without being limited thereto. In addition, the organic layer may be constituted by an organic material such as polyethylene terephthalate, polyethylene naphthalate, polycarbonate, polyimide, polyethylene sulfonate, polyoxymethylene, polyarylate, etc., or a mixture thereof, without being limited thereto.

In FIG. 4A, an aspect of the encapsulation layer part 470 is illustrated as being constituted by a triple layer of inorganic layer 471, organic layer 472, and inorganic layer 473.

A cover glass (not shown) may be disposed over the encapsulation layer part 470, and may be attached to the encapsulation layer part 470 by an adhesive layer (not shown). Although any material may be used as the adhesive layer, so long as the material exhibits excellent attachment force while being excellent in terms of heat resistance and water resistance, a thermosetting resin such as an epoxy-based compound, an acrylate-based compound, or an acryl-based rubber may be used in the present disclosure. Alternatively, a photo-curable resin may be used as the adhesive. In this case, the adhesive layer is cured through irradiation of the adhesive layer with light such as ultraviolet light.

The adhesive layer may serve to assemble the substrate 410 and the cover glass (not shown) and function as an encapsulator for preventing penetration of moisture into an interior of the display device which may be an organic electroluminescent display device.

The cover glass (not shown) may be an encapsulation cap for encapsulating the organic electroluminescent display device, and may use a protective film such as a polystyrene (PS) film, a polyethylene (PE) film, a polyethylene naphthalate (PEN) film, a polyimide (PI) film, or the like, and may use glass.

As apparent from the above description, in accordance with the exemplary aspect of the present disclosure, a pixel includes a driving thin film transistor including an oxide semiconductor pattern and a switching thin film transistor including an oxide semiconductor pattern, thereby blocking leakage current in an off state. Accordingly, a reduction in power consumption may be achieved. In addition, the driving thin film transistor according to the exemplary aspect of the present disclosure provides a structure capable of increasing an s-factor value and, as such, a thin film transistor array substrate capable of achieving free grayscale expression at low gray levels may be provided. In addition, a thin film transistor capable of increasing a threshold voltage of a driving thin film transistor in a pixel to a predetermined target value or greater. Furthermore, in accordance with the exemplary aspect of the present disclosure, a plurality of switching thin film transistors disposed in a pixel may have different threshold voltages and, as such, each of the switching thin film transistors may have characteristics suitable for a function thereof.

Effects of the present disclosure are not limited to the above-described effects. Other effects not described in the present disclosure may be readily understood by those skilled in the art from the appended claims.

It will be appreciated that the technical spirit of the present disclosure has been described herein only for purposes of illustration through the above description and the accompanying drawings, and that combination, separation, substitution, and modifications of components may be made by those skilled in the art without departing from the scope and spirit of the present disclosure. Therefore, the exemplary embodiments of the present disclosure are provided for illustrative purposes only and are not intended to limit the technical spirit of the present disclosure. The scope of the technical spirit of the present disclosure is not limited thereto. The protection scope of the present disclosure should be interpreted based on the appended claims, and it should be appreciated that all technical ideas falling within a range equivalent to the claims are included in the protection scope of the present disclosure.

What is claimed is:

1. A thin film transistor array substrate comprising:
   a substrate comprising an active area and a non-active area disposed around the active area; and
   a first thin film transistor disposed on the substrate, wherein the first thin film transistor comprises:
   a first oxide semiconductor pattern disposed over the substrate;
   a first gate electrode disposed under the first oxide semiconductor pattern while overlapping with the first oxide semiconductor pattern;
   a first source electrode and a first drain electrode disposed over and connected to the first oxide semiconductor pattern; and
   a first light shielding pattern disposed over the first oxide semiconductor pattern while overlapping with the first oxide semiconductor pattern, the first light shielding pattern being connected to one of the first source electrode and the first drain electrode, wherein a first distance between the first oxide semiconductor pattern and the first light shielding pattern is smaller than a second distance between the first oxide semiconductor pattern and the first gate electrode.

2. The thin film transistor array substrate of claim 1, wherein a first parasitic capacitance generated between the first oxide semiconductor pattern and the first light shielding pattern is greater than a second parasitic capacitance generated between the first oxide semiconductor pattern and the first gate electrode.

3. The thin film transistor array substrate of claim 1, further comprising a second thin film transistor disposed on the substrate, wherein the second thin film transistor comprises:

a second oxide semiconductor pattern disposed over the substrate;

a second gate electrode disposed under the second oxide semiconductor pattern while overlapping with the second oxide semiconductor pattern;

a second source electrode and a second drain electrode disposed over and connected to the second oxide semiconductor pattern; and a second light shielding pattern disposed over the second oxide semiconductor pattern while overlapping with the second oxide semiconductor pattern.

4. The thin film transistor array substrate of claim 3, wherein the first thin film transistor is configured to drive a pixel in the active area, and the second thin film transistor comprises a switching thin film transistor disposed in the pixel.

5. The thin film transistor array substrate of claim 3, wherein the second gate electrode and the second light shielding pattern are electrically interconnected and form a double gate.

6. The thin film transistor array substrate of claim 3, wherein the first light shielding pattern is disposed under a light emitting diode, and wherein the first source electrode or the first drain electrode is connected to the light emitting diode.

7. The thin film transistor array substrate of claim 3, wherein a capacitance formed by the first light shielding pattern increases a threshold voltage of the first thin film transistor.

8. The thin film transistor array substrate of claim 3, wherein a capacitance associated with a gate electrode of the second thin film transistor increases a threshold voltage of the second thin film transistor.

9. The thin film transistor array substrate of claim 3, wherein at least one of the first gate electrode or the first light shielding pattern comprises a semiconductor material layer.

10. The thin film transistor array substrate of claim 9, wherein at least one of the second gate electrode or the second light shielding pattern comprises the semiconductor material layer.

11. The thin film transistor array substrate of claim 9, wherein the semiconductor material layer comprises a P-type semiconductor material, and each of the first oxide semiconductor pattern and the second oxide semiconductor pattern comprise an N-type semiconductor material.

12. The thin film transistor array substrate of claim 3, wherein at least one of the second gate electrode or the second light shielding pattern comprises a semiconductor material layer.

13. The thin film transistor array substrate of claim 12, wherein at least one of the first gate electrode, the first light shielding pattern, the second gate electrode or the second light shielding pattern comprise a stacked structure comprising a metal pattern and the semiconductor material layer.

14. The thin film transistor array substrate of claim 13, wherein each of the first gate electrode and the second gate electrode comprises a stacked structure of the metal pattern and the semiconductor material, and each of the first light shielding pattern and the second light shielding pattern comprise a stacked structure of the semiconductor material layer and the metal pattern.

15. The thin film transistor array substrate of claim 13, wherein a light reflectivity of the semiconductor material layer is lower than a light reflectivity of the metal pattern.

16. A thin film transistor substrate comprising:

a substrate comprising an active area and a non-active area disposed around the active area;

a first thin film transistor disposed on the substrate;

a second thin film transistor disposed on the substrate; and a third thin film transistor disposed on the substrate, wherein the first thin film transistor comprises:

a first oxide semiconductor pattern disposed over the substrate;

a first gate electrode disposed under the first oxide semiconductor pattern while overlapping with the first oxide semiconductor pattern;

a first source electrode and a first drain electrode disposed over and connected to the first oxide semiconductor pattern; and a first light shielding pattern disposed over the first oxide semiconductor pattern while overlapping with the first oxide semiconductor pattern, the first light shielding pattern being connected to one of the first source electrode and the first drain electrode, wherein at least one of the first gate electrode or the first light shielding pattern comprises a semiconductor material layer, and wherein the second thin film transistor comprises:

a second oxide semiconductor pattern disposed over the substrate;

a second gate electrode disposed under the second oxide semiconductor pattern while overlapping with the second oxide semiconductor pattern;

a second source electrode and a second drain electrode disposed over and connected to the second oxide semiconductor pattern; and a second light shielding patter disposed over the second oxide semiconductor pattern while overlapping with the second oxide semiconductor pattern, and wherein the third thin film transistor comprises:

a polycrystalline semiconductor pattern disposed on the substrate;

a third gate electrode disposed over the polycrystalline semiconductor pattern while overlapping with the polycrystalline semiconductor pattern; and a third source electrode and a third drain electrode disposed over and connected to the polycrystalline semiconductor pattern.

17. The thin film transistor array substrate according of claim 16, wherein the third thin film transistor comprises a switching thin film transistor disposed in at least one of the active area or the non-active area.

18. The thin film transistor array substrate of claim 16, further comprising a storage capacitor disposed on the substrate, wherein the storage capacitor comprises a first electrode disposed on a same layer as the third gate electrode, and a second electrode disposed on a same layer as the first light shielding pattern.

19. The thin film transistor array substrate of claim 16, wherein the polycrystalline semiconductor pattern, the first gate electrode, and the second gate electrode are disposed on a same layer.

20. The thin film transistor array substrate of claim 16, wherein the first gate electrode, the second gate electrode, and the third gate electrode are disposed on a same layer.

21. The thin film transistor array substrate of claim 16, wherein each of the polycrystalline semiconductor pattern and the semiconductor material layer comprises a P-type semiconductor material, and each of the first oxide semiconductor pattern and the second oxide semiconductor pattern comprises an N-type semiconductor material.

22. The thin film transistor array substrate of claim 21, wherein the polycrystalline semiconductor pattern and the semiconductor material layer are formed by a same type of semiconductor material.

23. A display device comprising:

a thin film transistor array substrate including a light emitting device part connected to a first thin film transistor, wherein the light emitting device part comprises an anode connected to a first drain electrode, a cathode corresponding to the anode, and an organic light emitting layer disposed between the anode and the cathode, wherein the thin film transistor array substrate comprises:

a substrate comprising an active area and a non-active area disposed around the active area; and the first thin film transistor disposed on the substrate, wherein the first thin film transistor comprises:

a first oxide semiconductor pattern disposed over the substrate;

a first gate electrode disposed under the first oxide semiconductor pattern while overlapping with the first oxide semiconductor pattern;

a first source electrode and the first drain electrode disposed over and connected to the first oxide semiconductor pattern; and a first light shielding pattern disposed over the first oxide semiconductor pattern while overlapping with the first oxide semiconductor pattern, the first light shielding pattern being connected to one of the first source electrode and the first drain electrode, wherein a first distance between the first oxide semiconductor pattern and the first light shielding pattern is smaller than a second distance between the first oxide semiconductor pattern and the first gate electrode.

24. A method of forming a light emitting device, comprising:

depositing a buffer layer over an entire region of a substrate;

forming a first metal material layer, wherein the first metal layer includes a plurality of gate electrodes;

depositing a first gate insulating layer over the entire region including the plurality of gate electrodes;

forming a polycrystalline semiconductor pattern on the first gate insulating layer;

implanting ions of the polycrystalline semiconductor pattern to create conductive portions of the polycrystalline semiconductor pattern using the plurality of gate electrodes as an alignment mask;

depositing a second gate insulating layer over the entire region including the polycrystalline semiconductor pattern;

forming a first light shielding pattern over each region corresponding to a light emitting device;

forming source electrodes and gate electrodes over the first light shielding pattern, wherein each first light shielding pattern is coupled to a corresponding source electrode or gate electrode to increase a capacitance associated with at least one active device; and forming a plurality of light emitting devices over the source electrodes and the gate electrodes.

* * * * *